(12) United States Patent
Yurko

(10) Patent No.: US 7,349,221 B2
(45) Date of Patent: Mar. 25, 2008

(54) DEVICE FOR INCREASED THERMAL CONDUCTIVITY BETWEEN A PRINTED WIRING ASSEMBLY AND A CHASSIS

(75) Inventor: Joseph M. Yurko, Palm Harbor, FL (US)

(73) Assignee: Honeywell International Inc., Morristown, NJ (US)

( * ) Notice: Subject to any disclaimer, the term of this patent is extended or adjusted under 35 U.S.C. 154(b) by 8 days.

(21) Appl. No.: 11/458,776

(22) Filed: Jul. 20, 2006

(65) Prior Publication Data

US 2008/0019102 A1 Jan. 24, 2008

(51) Int. Cl.
*H05K 7/20* (2006.01)

(52) U.S. Cl. .............. 361/719; 361/707; 361/727; 361/728; 361/729; 361/730; 361/731; 361/732; 361/759; 361/801; 361/802; 361/715; 361/720; 361/726; 165/80.2; 165/80.3; 174/16.3; 174/252; 439/327; 411/79; 403/297; 403/409.1

(58) Field of Classification Search .......... 361/707, 361/715, 719, 720, 726–732, 759, 801, 802; 165/80.2, 80.3; 174/16.3, 252; 439/327; 411/79; 403/297, 409.1
See application file for complete search history.

(56) References Cited

U.S. PATENT DOCUMENTS

| 4,354,770 | A | * | 10/1982 | Block ................. 403/409.1 |
| 4,480,287 | A | * | 10/1984 | Jensen ................. 361/707 |
| 4,775,260 | A | * | 10/1988 | Kecmer ............... 403/409.1 |
| 4,819,713 | A | * | 4/1989 | Weisman ............... 165/80.2 |
| 4,824,303 | A | * | 4/1989 | Dinger ................. 411/79 |
| 5,200,882 | A | | 4/1993 | Blomquist |
| 5,220,485 | A | * | 6/1993 | Chakrabarti ............ 361/720 |
| 5,224,016 | A | * | 6/1993 | Weisman et al. ........ 361/728 |
| 5,262,587 | A | * | 11/1993 | Moser ................. 174/15.1 |
| 5,472,353 | A | * | 12/1995 | Hristake et al. ........ 439/327 |
| 5,485,353 | A | * | 1/1996 | Hayes et al. ........... 361/802 |
| 5,607,273 | A | * | 3/1997 | Kecmer et al. ......... 411/79 |
| 5,779,388 | A | * | 7/1998 | Yamamoto ............. 403/374.1 |
| 5,859,764 | A | * | 1/1999 | Davis et al. ........... 361/704 |
| 5,883,784 | A | * | 3/1999 | Hughes et al. ......... 361/707 |

(Continued)

OTHER PUBLICATIONS

Calmark Corporation, Series 240—"card-lok" retainer (cold plate), 2 pgs. (prior to May 1, 2006).

(Continued)

*Primary Examiner*—Boris Chervinsky
*Assistant Examiner*—Courtney L Smith
(74) *Attorney, Agent, or Firm*—Fogg & Powers LLC; Gregory M. Taylor

(57) ABSTRACT

A floating guide device provides increased thermal conductivity between a printed wiring assembly and a heat sink chassis. The guide device includes an elongated thermally conductive rod and a wedgelock used in conjunction with the rod that can be attached to the rod. The guide device can be used in an electronic assembly comprising a chassis having at least one slot, and at least one printed wiring assembly with a printed wiring board disposed in the slot. At least one integrated circuit package is electrically attached to the printed wiring board. The printed wiring board provides a thermal path to the chassis. The guide device provides one or more additional thermal paths between the printed wiring board and the chassis.

16 Claims, 5 Drawing Sheets

U.S. PATENT DOCUMENTS

| | | | |
|---|---|---|---|
| 5,949,650 A * | 9/1999 | Bulante et al. | 361/704 |
| 5,999,407 A * | 12/1999 | Meschter et al. | 361/704 |
| 6,007,358 A * | 12/1999 | Nagase | 439/327 |
| 6,151,215 A * | 11/2000 | Hoffman | 361/704 |
| 6,212,075 B1 * | 4/2001 | Habing et al. | 361/719 |
| 6,246,582 B1 * | 6/2001 | Habing et al. | 361/704 |
| 6,285,564 B1 * | 9/2001 | O'Brien | 361/801 |
| 6,385,053 B1 * | 5/2002 | Parizi et al. | 361/786 |
| 6,580,028 B1 * | 6/2003 | Mellberg et al. | 174/359 |
| 6,615,997 B2 * | 9/2003 | Danello et al. | 211/26 |
| 6,678,159 B1 * | 1/2004 | Barcley | 361/704 |
| 6,765,798 B1 * | 7/2004 | Ratliff et al. | 361/704 |
| 6,771,504 B2 * | 8/2004 | Barcley | 361/704 |
| 6,873,528 B2 * | 3/2005 | Hulan et al. | 361/719 |
| 7,031,167 B1 * | 4/2006 | Zagoory et al. | 361/759 |
| 7,180,737 B2 * | 2/2007 | Straub et al. | 361/690 |
| 2003/0030986 A1 * | 2/2003 | Centola et al. | 361/720 |

OTHER PUBLICATIONS

Calmark Corporation, Series 260—"card-lok" retainer (cold plate), 2 pgs. (prior to May 1, 2006).

* cited by examiner

DEVICE FOR INCREASED THERMAL CONDUCTIVITY BETWEEN A PRINTED WIRING ASSEMBLY AND A CHASSIS

The U.S. Government may have rights in the invention under a restricted government contract.

BACKGROUND TECHNOLOGY

The operation of electronic modules such as printed wiring assemblies, which include printed wiring boards or cards having various circuit packages attached thereto, creates heat that needs to be removed through heat exchange with a heat sink. Typically, the heat sink is a chassis such as a cold plate, which contains slots for holding individual printed wiring boards. The printed wiring boards are retained in the slots by wedgelocks, which are mechanically expanding assemblies that are fastened along one surface of the printed wiring board to hold the printed wiring board in direct contact with the cold plate.

Conventional wedgelocks that are used to secure conduction cooled printed wiring assemblies to a chassis provide limited thermal conductivity due to restricted thermal paths within the wedgelocks. Thermal transfer is also limited by the thermal resistance of the board material.

The thermal dissipation of electronics cards/boards is increasing at a rapid pace with the development of faster integrated circuit (IC) chips. This requires improvements in cooling design methods, particularly for space-borne applications which rely on conductive thermal transfer.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the present invention. The following detailed description is, therefore, not to be taken in a limiting sense.

The present invention is directed to a floating guide device that provides improved thermal performance by creating additional thermal paths from a printed wiring assembly (PWA) to a chassis. The guide device nearly doubles the conductive thermal pathways between an electronic card such as a printed wiring board (PWB) and the chassis in which the card is mounted, significantly reducing component operating temperatures. This temperature reduction increases the reliability of electronic systems, and enables the use of previously unemployable components.

In general, the guide device of the invention includes a thermally conductive rod that is attached to a wedgelock for use in a clamped PWA installation. In an electronic assembly, the guide device is positioned in a slot of a chassis by removably attaching the rod to a mounting surface in the slot. The guide device is clamped against the PWA when the wedgelock is torqued and expanded. This creates one or more additional thermal paths between the PWA and the chassis through the rod. The guide device effectively doubles the heat flow capacity from the PWA into the chassis walls. Further details of the present invention are described hereafter.

Figure 1:
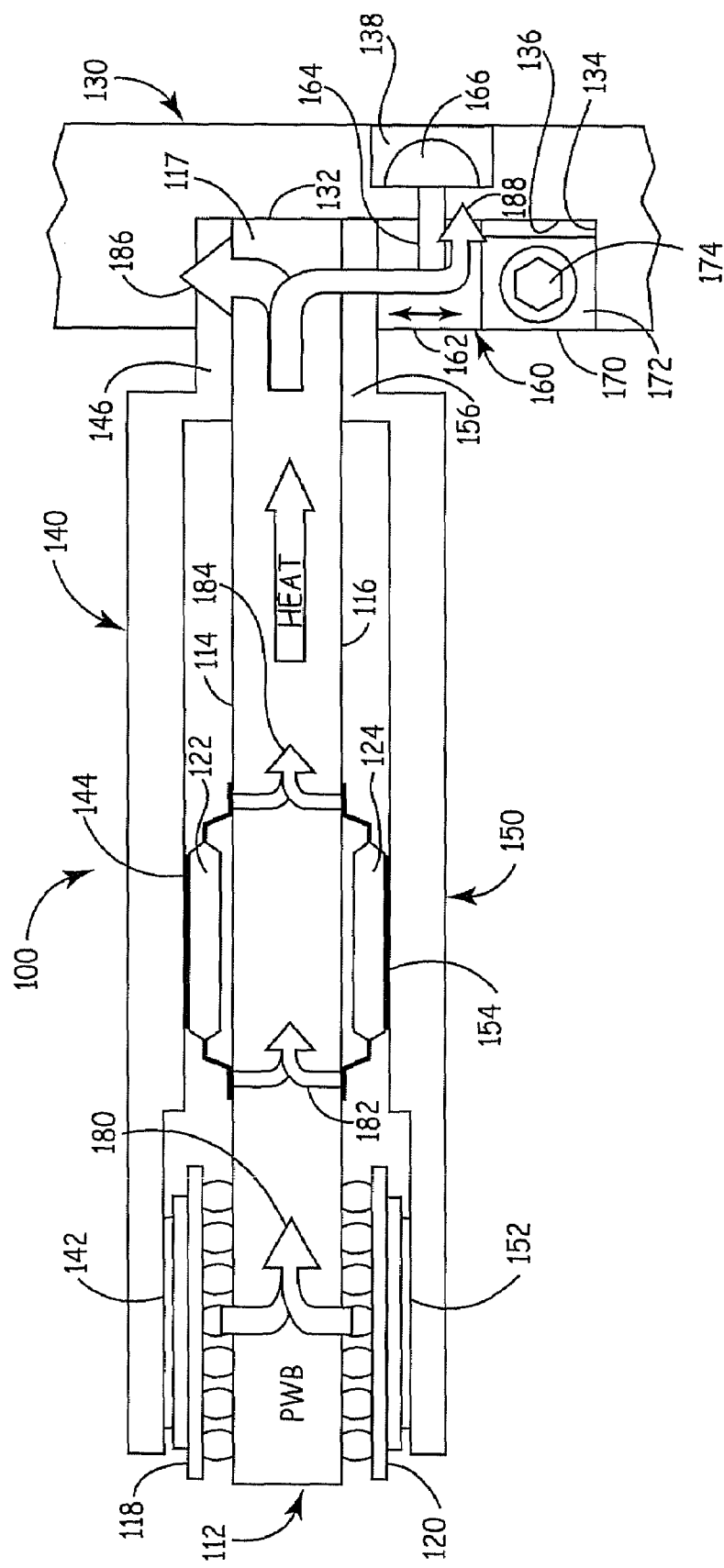
FIG. 1 is a schematic end view of a printed wiring assembly including a guide device according to one embodiment of the invention.

FIG. 1 is a schematic end view of an electronic assembly 100 including a printed wiring assembly (PWA) according to one embodiment of the invention. As shown, electronic assembly 100 includes a double-sided printed wiring board (PWB) 112 having a first side 114 and an opposite second side 116. A first integrated circuit (IC) package 118 such as a ball grid array (BGA) is electrically attached to first side 114 of PWB 112, and a second IC package 120 such as a BGA is electrically attached to second side 116. A third IC package 122 such as a small-outline integrated circuit (SOIC) is electrically attached to first side 114 of PWB 112, and a fourth IC package 124 such as an SOIC is electrically attached to second side 116.

A distal end portion 117 of PWB 112 is inserted into a heat sink chassis 130 such as a cold plate by way of a slot 132 in chassis 130. The slot 132 is defined by a sidewall 134 and a mounting surface 136. The width of slot 132 is such that it exceeds the width of PWB 112.

A first thermal bridge cover 140 is disposed over first side 114 and is in thermal contact with IC package 118 through a thermal bridge 142. The thermal bridge cover 140 is also in thermal contact with IC package 122 through a thermal bridge 144. A second thermal bridge cover 150 is disposed over second side 116 and is in thermal contact with IC package 120 through a thermal bridge 152. The thermal bridge cover 150 is also in thermal contact with IC package 124 through a thermal bridge 154. The thermal bridge cover 140 has a narrowed end portion 146 in contact with a distal portion of first side 114, and thermal bridge cover 150 has a narrowed end portion 156 in contact with a distal portion of second side 116.

The thermal bridge covers 140 and 150 can be composed of a thermally conductive material such as aluminum, an aluminum alloy, copper, a copper alloy, a carbon composite, Albemet, and the like. The thermal bridges 142, 144, 152, and 154 can be composed of a thermal interface material such as an epoxy, a putty, a gel, etc.

A floating guide device 160 is positioned in slot 132 and includes an elongated thermally conductive rod 162 used in conjunction with a wedgelock 170. One or more mounting apertures 164 can be provided in rod 162 to removably connect rod 162 to mounting surface 136 of chassis 130. The guide device 160 can be connected to mounting surface 136 by mating apertures 164 with one or more connectors 166 such as bolts that are loosely inserted into a respective slotted aperture 138 in chassis 130. The guide device 160 is allowed to "float" since it is loosely engaged with connectors 166 prior to expansion of wedgelock 170.

The wedgelock 170 generally comprises a plurality of wedge segments 172. A shaft 174 such as a screw with a threaded end portion extends through wedge segments 172. At least one of the wedge segments is configured to move away from at least one of the other wedge segments when shaft 174 is torqued, thereby expanding the effective width of wedgelock 170 and providing a clamping force to rod 162. This clamps rod 162 against end portion 156 of thermal bridge cover 150, thereby providing an additional thermal path from PWB 112 to chassis 130. The wedgelock 170 can be attached to rod 162 with conventional adhesives or fasteners prior to insertion of guide device 160 into slot 132. The floating guide device is discussed in more detail with respect to FIG. 3 hereafter.

As shown in FIG. 1, during operation of the IC packages, heat is transferred into PWB 112 along multiple thermal paths 180, 182, and 184. Heat is also transferred into thermal bridge covers 140 and 150. The heat from PWB 112 travels into chassis 130 along a first thermal exit path 186. The heat from PWB 112 also travels into chassis 130 along at least one additional thermal exit path 188 provided by guide device 160. This effectively doubles the heat low capacity from the PWA into the chassis.

It should be understood that the guide device of the invention is not limited to use in the PWA configuration shown in FIG. 1. For example, the guide device can also be used in conjunction with single-sided printed wiring assemblies having one or more IC packages on one side of a PWB, either with or without a thermal bridge cover. Also, a double-sided PWB without thermal bridge covers can employ the guide device.

Figure 2:
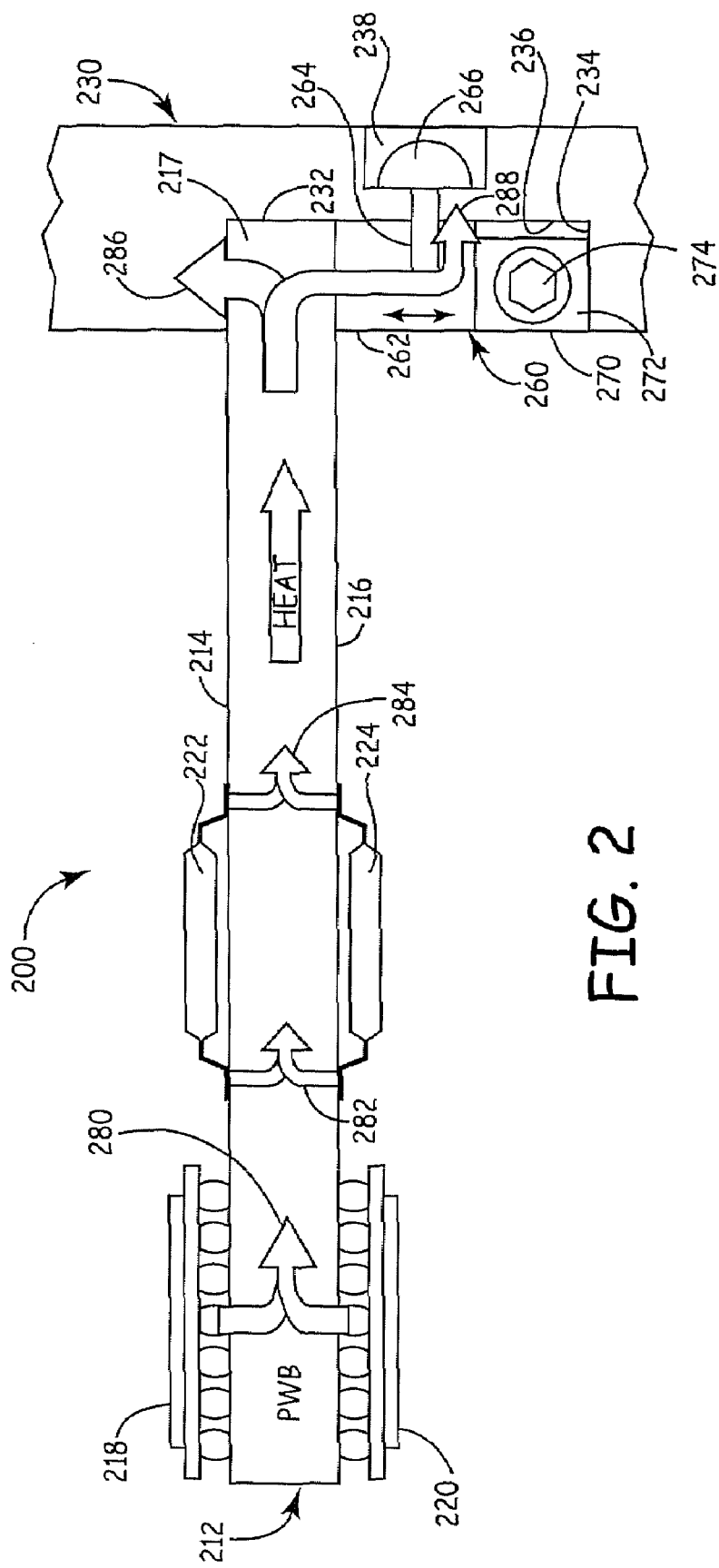
FIG. 2 is a schematic end view of a printed wiring assembly including a guide device according to another embodiment of the invention.

For example, FIG. 2 depicts an electronic assembly 200 according to another embodiment that has features similar to those of electronic assembly 100, but lacks the thermal bridge covers. Accordingly, electronic assembly 200 includes a double-sided PWB 212 having a first side 214 and an opposite second side 216. A first IC package 218 such as a BGA is electrically attached to first side 214 of PWB 212, and a second IC package 220 is electrically attached to second side 216. As shown, a third IC package 222 such as a SOIC can be electrically attached to first side 214 of PWB 212, and a fourth IC package 224 can be electrically attached to second side 216.

A distal end portion 217 of PWB 212 is inserted into a heat sink chassis 230 such as a cold plate by way of a slot 232 in chassis 230. The slot 232 is defined by a sidewall 234 and a mounting surface 236.

A floating guide device 260 is positioned in slot 232 and includes an elongated thermally conductive rod 262 used in conjunction with a wedgelock 270. One or more mounting apertures 264 can be provided in rod 262 to removably connect rod 262 to mounting surface 236 of chassis 230. The guide device 260 can be connected to mounting surface 236 by mating apertures 264 with one or more connectors 266 that are loosely inserted into a respective slotted aperture 238 in chassis 230.

The wedgelock 270 generally comprises a plurality of wedge segments 272. A shaft 274 such as a screw with a threaded end portion extends through wedge segments 272. When shaft 274 is torqued, wedgelock 270 is expanded and clamps rod 262 against end portion 217 of PWB 212, thereby providing an additional thermal path from PWB 212 to chassis 230. The wedgelock 270 can be attached to rod 262 with conventional adhesives or fasteners prior to insertion of guide device 260 into slot 232.

As shown in FIG. 2, during operation of the IC packages, heat is transferred into PWB 212 along multiple thermal paths 280, 282, and 284. The heat from PWB 212 travels into chassis 230 along a first thermal exit path 286. The heat from PWB 212 also travels into chassis 230 along at least one additional thermal exit path 288 provided by guide device 260.

Figure 3:
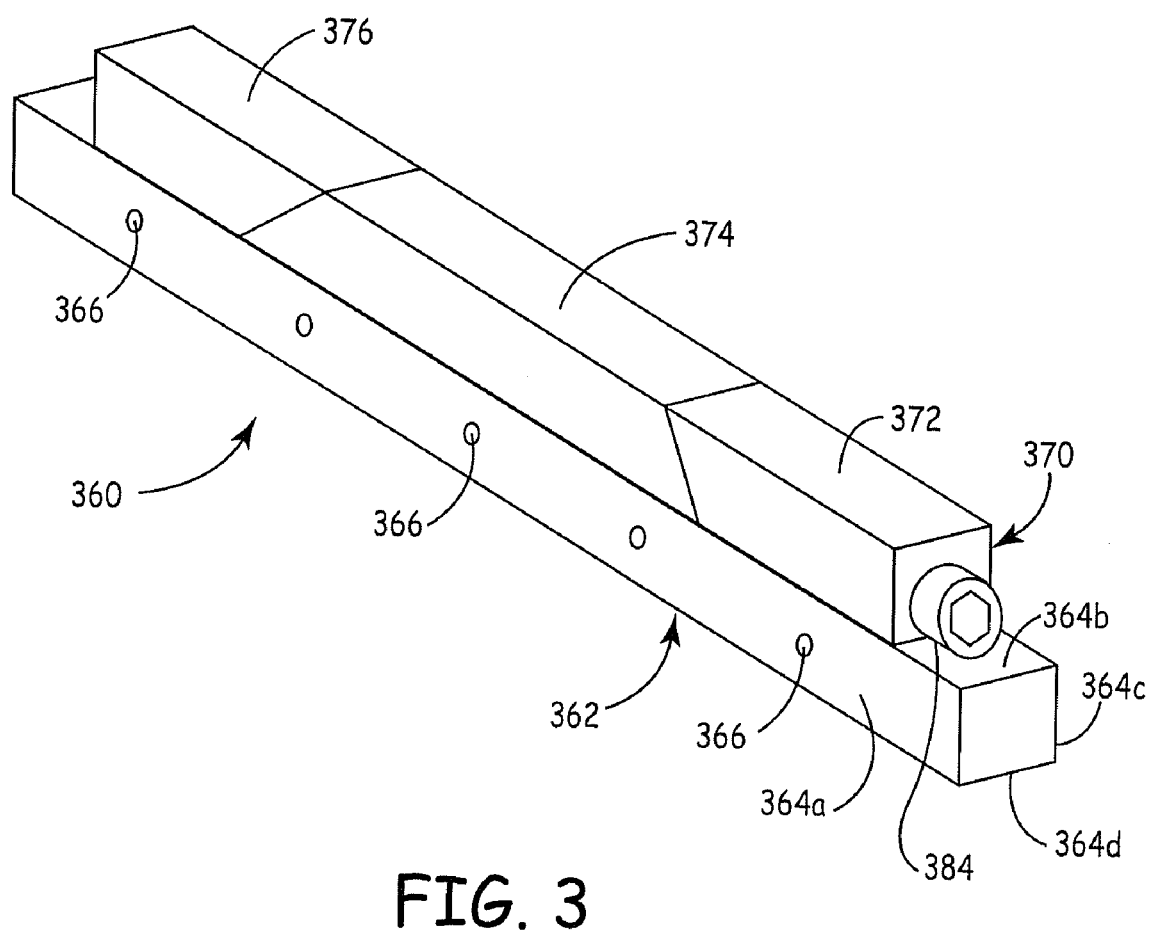
FIG. 3 is a perspective view of a guide device according to an embodiment of the invention.

FIG. 3 is a perspective view of a floating guide device 360 that can be used in the PWA configurations of FIGS. 1 and 2. The guide device 360 includes an elongated thermally conductive rod 362, which is similar to rods 162 and 262 of FIGS. 1 and 2. The rod 362 has four elongated sides 364a, 364b, 364c, and 364d with a substantially rectangular shape. The rod 362 can be provided with connecting apertures 366 along a side thereof (e.g., side 364a and/or 364c) for removably connecting rod 362 to a chassis mounting surface.

The rod of the guide device is composed of a thermally conductive material such as aluminum, an aluminum alloy, copper, a copper alloy, stainless steel, or combinations thereof. The rod can also be plated with a soft metal to give some flexibility to the surface areas to allow mating surfaces to more readily conform to each other. For example, copper, gold or other soft metal plating can be applied over a rod made of aluminum. In an alternative embodiment, the rod can be notched to provide some flexibility so that the rod conforms to mating surfaces more readily when compressed. The rod can be fabricated by a conventional machining process from a solid piece of thermally conductive material.

The guide device 360 also includes a wedgelock 370, which can be a conventional wedge clamp used to secure a PWB in a chassis. As shown in FIG. 3, wedgelock 370 includes a series of three wedge segments 372, 374, and 376, although a wedgelock with more wedge segments can also be used. A shaft 384 extends through wedge segments 372, 374, and 376. When shaft 384 is torqued, the effective width of wedgelock 370 is expanded since wedge segment 374 moves laterally with respect to wedge segments 372 and 376.

Figure 4A:
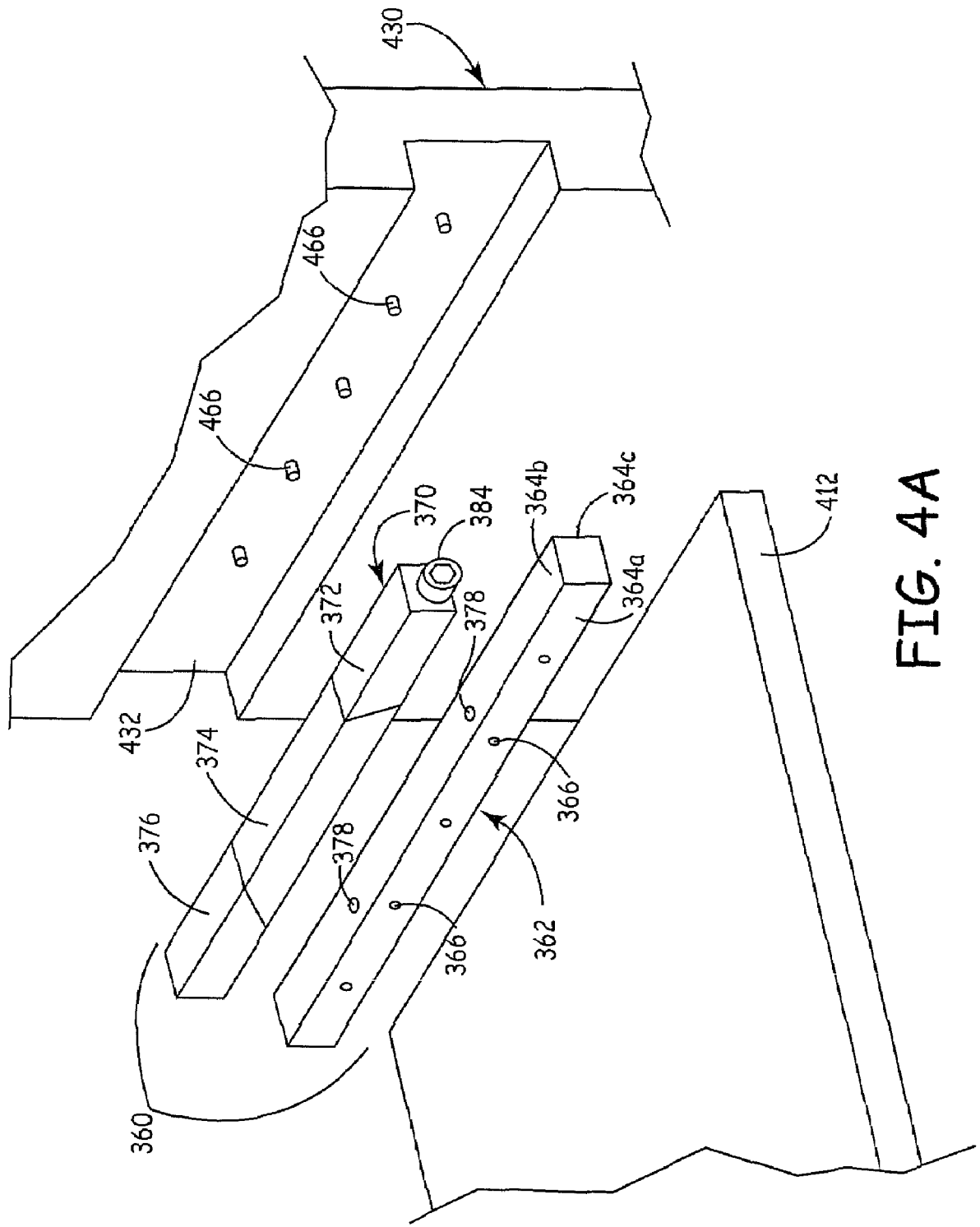
FIG. 4A is an exploded perspective view of the guide device shown in FIG. 3 shown in relation to a printed wiring board and a chassis.
Figure 4B:
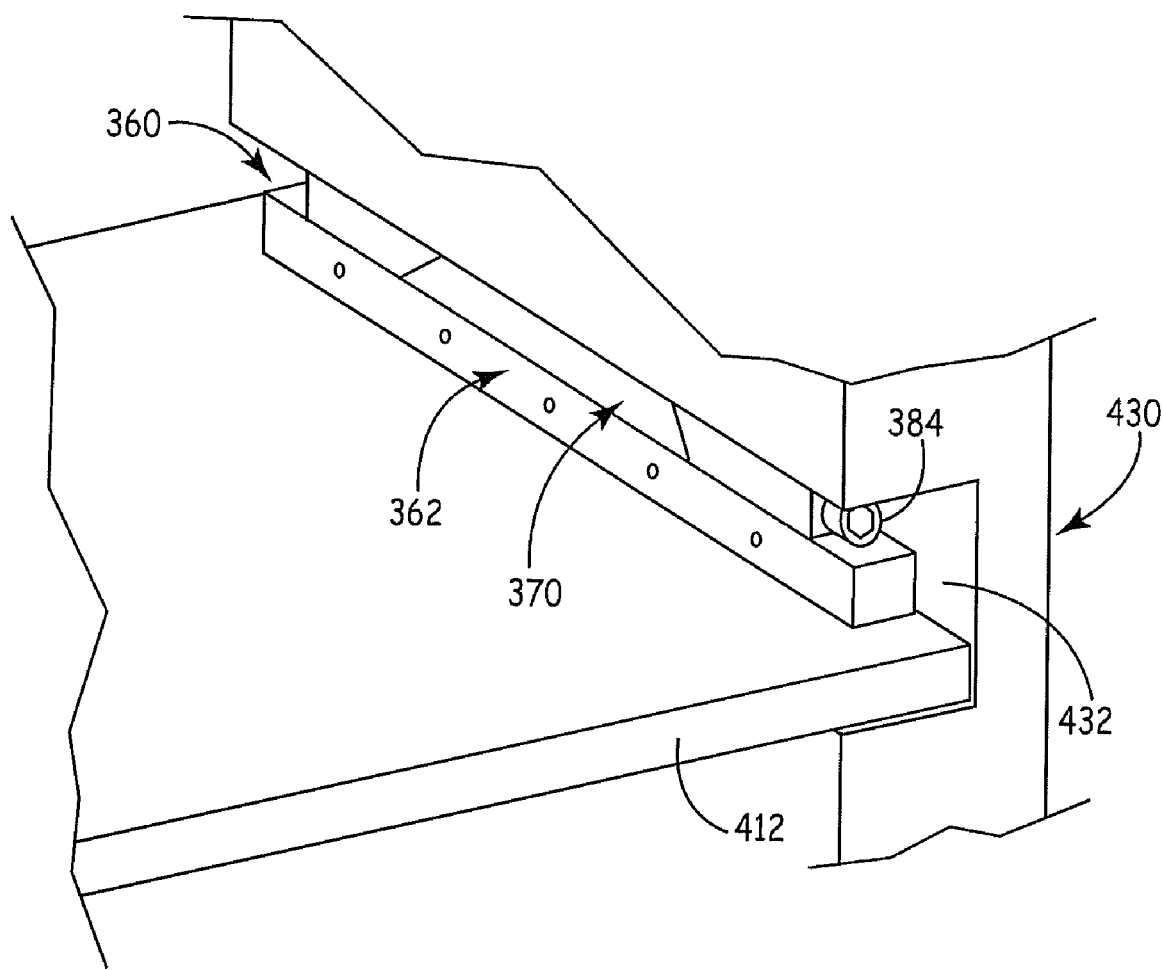
FIG. 4B is a perspective view of the guide device shown in FIG. 3 inserted into a chassis along with a printed wiring board.

The wedgelock 370 can be attached to rod 362 with conventional adhesives or connectors. For example, as depicted in FIG. 4A, a set of mounting holes 378 can be provided on side 364b of rod 362. The mounting holes 378 can be mated with corresponding connectors (not shown) on wedge 374 to attach rod 362 to wedgelock 370. Once rod 362 and wedgelock 370 are connected together, guide device 360 and a PWB 412 can be inserted into a chassis 430 having a slot 432. The apertures on side 364c of rod 362 are mated with a set of corresponding connectors 466 in slot 432 to loosely attach guide device 360 in slot 432. When shaft 384 is torqued, wedgelock 370 is expanded and clamps rod 362 against PWB 412 in slot 432 as shown in FIG. 4B. This provides an additional thermal path from PWB 412 to chassis 430.

The present invention may be embodied in other specific forms without departing from its essential characteristics. The described embodiments are to be considered in all respects only as illustrative and not restrictive. For example, the guide device can be used in a PWA without connecting the wedgelock and rod together. Also, the guide device can be inserted into the slot of a chassis without use of connectors on the mounting surface of the slot.

The scope of the invention is therefore indicated by the appended claims rather than by the foregoing description. All changes that come within the meaning and range of equivalency of the claims are to be embraced within their scope.

What is claimed is:

1. A guide device for providing an additional thermal path from a printed wiring assembly to a chassis, the guide device comprising:
   an elongated thermally conductive rod having a plurality of mounting apertures for removably connecting the rod to a chassis mounting surface, the chassis mounting surface having a plurality of connectors in a slot that are configured to mate with the plurality of mounting apertures; and
   a wedgelock attached to the rod and comprising a plurality of wedge segments, wherein at least one of the wedge segments is configured to move away from at least one of the other wedge segments to expand the wedgelock;
   wherein when the rod is connected to the chassis mounting surface and the wedgelock is torqued to clamp the rod against a portion of the printed wiring assembly in the chassis, an additional thermal path is created from the printed wiring assembly to the chassis through the rod.

2. The guide device of claim 1, wherein the rod has four elongated surfaces that are a substantially rectangular shape.

3. The guide device of claim 1, wherein the rod comprises aluminum, an aluminum alloy, copper, a copper alloy, stainless steel, or combinations thereof.

4. The guide device of claim 3, wherein the rod is plated with copper, gold, or any other soft metal.

5. An electronic assembly, comprising:
   a heat sink chassis having at least one slot defined by a sidewall and a mounting surface;
   at least one printed wiring assembly comprising:
      a printed wiring board including a first side and an opposite second side, the printed wiring board including an end portion disposed in the slot that provides a thermal path to the sidewall of the chassis; and
      at least one integrated circuit package electrically attached to the first side of the printed wiring board; and
   a guide device disposed in the slot, the guide device comprising an elongated thermally conductive rod and a wedgelock, the guide device having one or more apertures in the rod for connecting the rod to the mounting surface of the slot; wherein the chassis has one or more connectors in the slot that mate with the one or more apertures in the rod; and
   wherein the rod of the guide device provides an additional thermal path from the printed wiring board to the chassis.

6. The electronic assembly of claim 5, further comprising a second integrated circuit package electrically attached to the second side of the printed wiring board.

7. The electronic assembly of claim 6, further comprising a third integrated circuit package electrically attached to the first side of the printed wiring board.

8. The electronic assembly of claim 7, further comprising a fourth integrated circuit package electrically attached to the second side of the printed wiring board.

9. The electronic assembly of claim 5, wherein the guide device is removably connected to the mounting surface of the slot.

10. The electronic assembly of claim 5, wherein the rod has four elongated surfaces that are a substantially rectangular shape.

11. The electronic assembly of claim 5, wherein the rod comprises aluminum, an aluminum alloy, copper, a copper alloy, stainless steel, or combinations thereof.

12. The electronic assembly of claim 11, wherein the rod is plated with copper, gold, or any other soft metal.

13. The electronic assembly of claim 5, further comprising a thermal bridge cover disposed over the first side and in thermal communication with the integrated circuit package, the thermal bridge cover having an end portion disposed in the slot.

14. An electronic assembly, comprising:
   a heat sink chassis having at least one slot defined by a sidewall and a mounting surface;
   at least one printed wiring assembly comprising:
      a printed wiring board including a first side and an opposite second side, the printed wiring board including an end portion disposed in the slot that provides a thermal path to the sidewall of the chassis;
      at least one integrated circuit package electrically attached to the first side of the printed wiring board;
      at least one integrated circuit package electrically attached to the second side of the printed wiring board;
      a first thermal bridge cover disposed over the first side and in thermal communication with the integrated circuit package attached to the first side of the printed wiring board, the first thermal bridge cover having an end portion disposed in the slot; and
      a second thermal bridge cover disposed over the second side and in thermal communication with the integrated circuit package attached to the second side of the printed wiring board, the second thermal bridge cover having an end portion disposed in the slot; and
   a guide device disposed in the slot, the guide device comprising an elongated thermally conductive rod and a wedgelock, the guide device having one or more apertures in the rod for connecting the rod to the mounting surface of the slot; wherein the chassis has one or more connectors in the slot that mate with the one or more apertures in the rod; and
   wherein the rod of the guide device provides an additional thermal path from the printed wiring board to the chassis.

15. The electronic assembly of claim 14, wherein the guide device is removably connected to the mounting surface of the slot.

16. The electronic assembly of claim 14, wherein the thermal bridge covers comprise aluminum, an aluminum alloy, copper, a copper alloy, a carbon composite, stainless steel, or combinations thereof.

* * * * *